United States Patent [19]

Sado

[11] 4,330,165
[45] May 18, 1982

[54] PRESS-CONTACT TYPE INTERCONNECTORS

[75] Inventor: Ryoichi Sado, Saitama, Japan

[73] Assignee: Shin-Etsu Polymer Co., Ltd., Tokyo, Japan

[21] Appl. No.: 160,729

[22] Filed: Jun. 18, 1980

[30] Foreign Application Priority Data

Jun. 29, 1979 [JP] Japan .................. 54-89164[U]

[51] Int. Cl.³ .................................. H01R 13/48
[52] U.S. Cl. ........................................ 339/59 M
[58] Field of Search ............ 339/17 M, 17 LM, 61 R, 339/61 M, DIG. 3, 59 R, 59 M; 174/35 GC

[56] References Cited

U.S. PATENT DOCUMENTS

| | | | |
|---|---|---|---|
| 3,795,037 | 3/1974 | Luttmer | 339/61 M X |
| 3,862,790 | 1/1975 | Davies et al. | 339/17 LM |
| 3,934,959 | 1/1976 | Gilissen | 339/59 M X |

FOREIGN PATENT DOCUMENTS 2703759 3/1978 Fed. Rep. of Germany ... 339/DIG. 3

*Primary Examiner*—Joseph H. McGlynn
*Assistant Examiner*—Frank H. McKenzie, Jr.
*Attorney, Agent, or Firm*—Hopgood, Calimafde, Kalil, Blaustein & Judlowe

[57] ABSTRACT

The invention provides a novel interconnector of press-contact type of a rod-like configuration used as sandwiched between two circuit boards for electric connection therebetween. Different from the conventional interconnectors of the similar types composed of a rod-like member of an insulating rubbery elastomer and a plurality of linear conductive bodies embedded in the rod member penetrating therethrough, the inventive interconnector is further provided with at least one insulating sheet member made of a material with higer rigidity than the rubbery elastomer as embedded within or bonded to the surface of the rod member extending longitudinally. By virtue of the sheet member, the Poisson deformation of the rod member in the longitudinal direction under a compression is prevented so as to improve the reliability of the electric connection. Further, the sheet member is bent or curved as viewed in the longitudinal direction so as to facilitate absorption of the local stress in the rod member under compression in contribution to further improvement of the stability in the electric connection with the interconnector.

2 Claims, 10 Drawing Figures

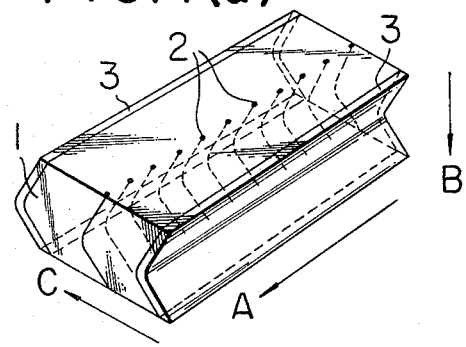 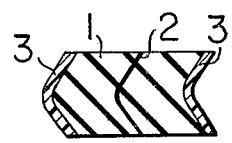
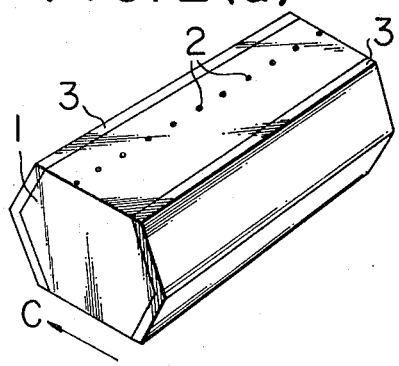 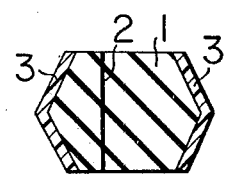

PRESS-CONTACT TYPE INTERCONNECTORS

BACKGROUND OF THE INVENTION

The present invention relates to a novel and improved press-contact type interconnector of elongated form or, more particularly, to an interconnector used, for example, as sandwiched between a printed circuit board for electronic operation circuit and a circuit board bearing a functional device to establish electric connection therebetween.

It is a common practice that an electronic functional device such as a liquid display unit, electroluminescence display unit or the like is mounted on a circuit board for the operation thereof with a press-contact type interconnector of elongated form sandwiched therebetween to obtain electric connection between them, such an interconnector being electrically conductive only in the direction perpendicular to the longitudinal direction thereof to give an electric connection between the contacting terminals oppositely positioned on both sides of the interconnector.

Interconnectors of this type are described, for example, in U.S. Pat. Nos. 3,795,037 and 3,862,790, Japanese Patent Disclosure No. 53-147991 and others. The interconnectors disclosed there are formed of an elongated rod member made of an electrically insulating rubbery elastomer and a multiplicity of linear or fibrous bodies having electroconductivity embedded in the insulating rubber matrix approximately in alignment in one direction perpendicular to the longitudinal direction of the rod member throughout its length.

One of the problems in the interconnectors of the above described type is that, when the interconnector is sandwiched between two circuit boards with a pressure sufficient to obtain reliable electric connection between them, the rubber matrix of the rod member becomes extended or stretched perpendicularly to the direction of compression, e.g. in the longitudinal direction of the rod member in proportion to the compression by the pressure which is perpendicular to the plane of the circuit boards to be electrically connected owing to the relatively large Poisson's ratio of the rubbery material. This longitudinal extension of the rod member necessarily leads to the decrease in the density of the linear or fibrous conductive bodies or to the disorder in the electric contact between the interconnector and the circuit board. This undesirable phenomenon is most remarkable in the end portions of the elongated interconnector. An attempt to avoid the above problem by increasing the clamping pressure at the end portions is unsuccessful due to the possible unevenness of the contacting condition in the intermediate portions.

The interconnector described in Japanese Patent Disclosure 52-107566 is improved in respect of the above problem but it is never satisfactory with a requirement of very large compression stress in mounting to obtain uniform contacting because each of the linear conductive bodies in texture is bent in the reverse direction to the neighboring ones.

SUMMARY OF THE INVENTION

An object of the present invention is therefore to provide a novel and improved interconnector of an elongated rod-like form free from the above described problems of the conventional interconnectors of the similar types.

Thus, the press-contact type interconnector of the present invention comprises
  (a) a rod member made of an electrically insulating rubbery elastomer having two opposite surfaces longitudinally extending substantially in parallel with each other,
  (b) a plurality of linear bodies of an electrically conductive material embedded in the rod member as distributed over substantially whole length of the rod member and as oriented in such a manner that the ends of each of the linear bodies appear on the opposite surfaces of the rod member, and
  (c) at least one sheet member of an electrically insulating, flexible material having higher rigidity than the electrically insulating rubbery elastomer of the rod member and embedded within or bonded to the surface of the rod member as extending in the direction in parallel to the longitudinal direction of the rod member in such a disposition that the sheet member is bent or curved as viewed in the longitudinal direction of the rod member.

BRIEF DESCRIPTION OF THE DRAWING

FIG. 1(a) and FIG. 2(a) are each a perspective view of an inventive interconnector having two sheet members bonded on the surfaces of the rod member and FIG. 1(b) and FIG. 2(b) are each a cross sectional view of the interconnector as cut perpendicularly to the longitudinal direction.

DETAILED DESCRIPTION OF THE PREFERRED EMBODIMENTS

Figure 3A:
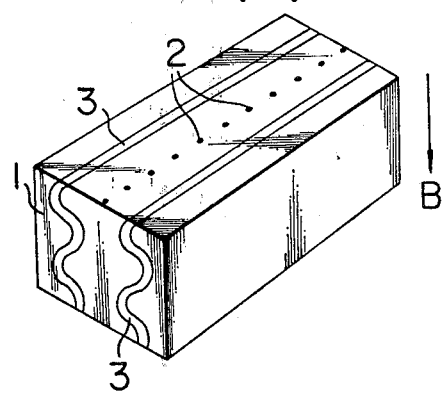
FIG. 3(a) and FIG. 3(b) are a perspective view and a cross sectional view, respectively, of an inventive interconnector having two sheet members embedded in the rod member.

The electrically insulating rubbery elastomer of the rod member of the inventive interconnector, which serves as the matrix for the electrically conductive linear bodies, can be any kind of natural and synthetic rubbers as well as certain thermoplastic resins having adequate elasticity. It is recommended that this material is not excessively rigid having a rubber hardness of 70 or below or, preferably, 50 or below by the Shore A scale. It is of course optional that this material has a porous or cellular, spongy structure.

This rubbery elastomer is required to exhibit adequate elastic behavior so as to be able to follow the bending of the linear conductive bodies in mounting of the interconnector and their regain of original configuration in dismounting of the interconnector. Further, the elastic property of the material should be selected so as to ensure good close contact with the circuit board when the interconnector is mounted between the circuit boards. Particularly recommended material in these connections is a silicone rubber.

The shape or configuration of the rod member is determined, of course, according to particular need in respects of length and cross section. In any way, the rod member has two opposite surfaces extending in the longitudinal direction substantially in parallel with each other to form the contacting surfaces with the circuit boards.

The material of the linear electroconductive bodies is selected from a variety of conductive materials. Several of the examples are carbon fibers prepared by carbonization or graphitization of organic fibrous materials including natural, regenerated and synthetic fibers such as cellulosic fibers, polyacrylonitrile fibers, polyvinyl alcohol fibers and the like as well as fibrous bodies obtained by spinning petroleum pitches and phenolic resins. Metallic materials are of course suitable for the purpose in the forms of filaments and ribbons prepared by a conventional method. Further, the linear electroconductive bodies may be fibers or strings of resins or rubbers filled with carbon black or other conductivity-imparting material such as carbon black-filled polyamide or polyester fibers and strings of a rubber filled with carbon black or metal powder. Fibers and ribbons of an insulating material provided with coating layers of an electroconductive coating composition are also suitable.

The cross sectional shapes and the cross sectional dimensions are not limitative according to need. For example, a diameter of 3 to 200 $\mu$m is suitable when the linear body has a circular or annular cross section and a ribbon-like linear body may have a width of 30 to 2000 $\mu$m and a thickness of 5 to 200 $\mu$m.

In shaping the rod member with the linear conductive bodies embedded therein, it is optional or sometimes recommendable that the surface of the linear bodies is treated in advance with a primer or the rubbery elastomer is admixed with a suitable coupling agent in order to increase the adhesive bonding strength between the linear conductive bodies and the rubbery elastomer as the matrix.

The length of each of the linear conductive bodies should be as long as that both ends thereof appear on the opposite surfaces of the rod member coming into contact with the contacting terminals on the circuit board when the interconnector is mounted as sandwiched between the circuit boards. It is optional that the ends of the linear conductive body slightly protrude above or are recessed from the surface of the rod member in such an extent that close contacting is ensured between the interconnector and the circuit board by the compression in mounting. Such a protrusion or recess is very conventional due to the difference between the shrinkage or thermal expansion between the linear conductive bodies and the rubbery elastomer of the rod member.

The configuration of the linear conductive bodies embedded in the rubber matrix of the rod member is not necessarily straightforward but may be curved or bent as is shown in the attached figures. Such a curved or bent configuration is rather preferable since the elastic resilience of the linear bodies can be effectively utilized when the interconnector is mounted between two circuit boards.

The third component of the inventive interconnector is a sheet member embedded within or bonded to the surface of the rod member as extending in the longitudinal direction of the rod member. That is, the interconnector of the invention is provided with at least one sheet member, by virtue of which the longitudinal extension of the rod member under compression is effectively limited or prevented. In this connection, the sheet member should have higher rigidity than the rubbery elastomer of the rod member so as to be able to restrict the longitudinal extension of the rod member under compression with its rigidity. Yet, the material of the sheet member should have flexibility not to unduly hinder bulging out of the rod member in the lateral direction. The sheet member has desirably a Young's modulus 1.5 times or, preferably, 2.0 times larger than that of the rubbery elastomer of the rod member in order to fully exhibit the benefit of the composite structure.

In so far as the above principle is complied with, the material of the sheet member is not limitative including films and fabrics of various kinds of organic and inorganic insulating materials such as polyethylene terephthalate resins, polytetramethylene terephthalate resins, polyamide resins, polyimide resins, polyether resins, polydiphenylpropane therephthalate resins and the like as well as glass fiber-reinforced epoxy resins, triazine resins, polyester resins and the like. The sheet member is integrated with the rod member either by integral molding with the rubbery elastomer or by bonding with the aid of an adhesive agent on to the lateral surface of the pre-shaped rod member. The thickness of the sheet member is also not limitative and should be determined in consideration of the property relationship between the rubbery elastomer and the sheet member and the particular need for the interconnector. It is usually in the range from a few $\mu$m to 200 $\mu$m but the thickness of a sheet member or total thickness of the sheet members when a plurality of them are used in an interconnector should not exceed 40% of the maximum width, i.e. the length in the direction perpendicular to both the longitudinal direction and the direction of the compression, of the rod member.

Following is a further description of the inventive interconnectors by way of examples illustrated in the drawing attached hereto. Each of the embodiments is shown by the perspective view marked with (a) and a cross sectional view marked with (b) as cut in a plane perpendicular to the longitudinal direction.

The interconnector of the invention illustrated in FIG. 1 is composed of an elongated rod member 1 made of a rubbery elastomer, a plurality of linear electrically conductive bodies 2 embedded in the rod member 1 and two sheet members 3,3 bonded to the lateral surfaces of the rod member 1. The ends of each of the linear bodies 2 appear on the opposite surfaces, i.e. the top surface and the bottom surface, of the rod member 1 forming the contacting surfaces with the circuit boards between which the interconnector is to be mounted as sandwiched.

The distribution of the linear bodies 2 covers substantially whole length in the direction shown by the arrow A of the rod member 1 and the linear bodies 2 are in alignment in the direction shown by the arrow B.

When the interconnector of FIG. 1 is mounted between two circuit boards with the contacting surfaces having the ends of the linear bodies 2 in contact therewith, it undergoes a compression in the direction shown by the arrow B so that the rod member 1 is bulged out in the lateral direction shown by the arrow C and, if the rod member 1 is not provided with the sheet members 3,3, becomes extended also in the longitudinal direction shown by the arrow A. In the inventive interconnector, on the contrary, the longitudinal extension of the rod member 1 is effectively prevented by the sheet members 3,3 having higher rigidity than the rubbery elastomer of the rod member 1 so that the Poisson deformation of the rod member 1 takes place only in the lateral direction shown by the arrow C. In order to smoothly comply with this deformation in the lateral direction and to absorb any localized stress in the rod member 1, the sheet member 3 should desirably be bent or curved as viewed in the longitudinal direction shown by the arrow A. The interconnector shown in FIG. 1 has two sheet members 3,3 one being convexly bent and the other being concavely bent (the lefthand one and the righthand one, respectively).

The linear conductive bodies 2 are also bent at about the center portions thereof so as to be in alignment in approximate parallelism with the sheet members 3,3 bent as mentioned above so as that the elastic resilience of the linear bodies 2 can be most effectively utilized when the interconnector is mounted between two circuit boards with compressive force in the direction shown by the arrow B.

The interconnector shown in FIG. 2 is similar to that shown in FIG. 1 except that both of the sheet members 3,3, are bent convexly and the linear conductive bodies 2 are not bent but straightforwardly penetrating the rod member 1 between two opposite surfaces.

Figure 3B:
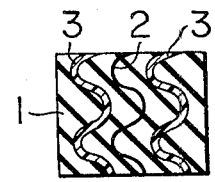

FIG. 3 illustrates another embodiment of the inventive interconnectors having a rectangular cross section of the rod member 1 within which two sheet members 3,3 are integrally embedded. Each of the sheet members 3,3 has an undulating configuration as is shown by the wavy cross section shown in FIG. 3(b). Correspondingly to the wavy configuration of the sheet members 3,3, the linear conductive bodies 2 are also curved in wavy forms to be in approximate parallelism with the sheet members 3,3.

Figure 4A:
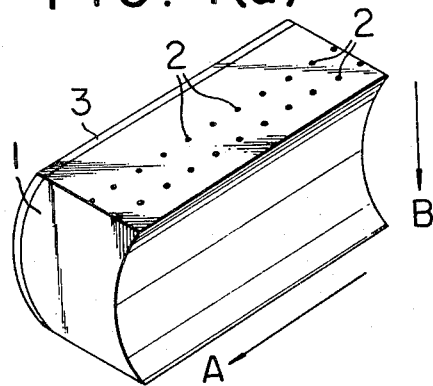
FIG. 4(a) and FIG. 4(b) are a perspective view and a cross sectional view, respectively, of an inventive interconnector having a single sheet member bonded on the surface of the rod member.
Figure 4B:
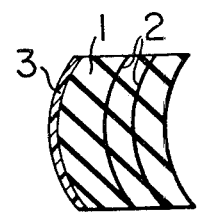

The interconnector shown in FIG. 4 has a cross section something like a sector, that is, one of the lateral surfaces is convexly bulged while the other of the lateral surfaces is recessed concavely. It is provided with a single sheet member 3 bonded on the bulged surface of the rod member 1 as curved along the surface and the linear conductive bodies 2 are arranged in two rows instead of a single row as in the preceding examples.

Figure 5A:
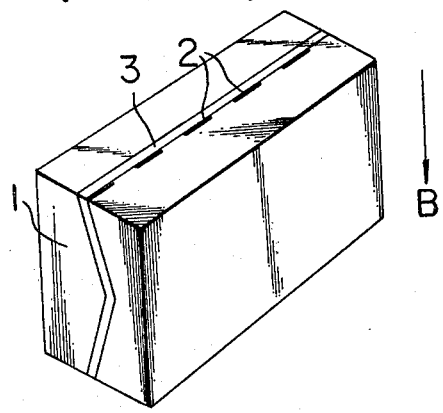
FIG. 5(a) and FIG. 5(b) are a perspective view and a cross sectional view, respectively, of an inventive interconnector having a single sheet member embedded within the rod member.
Figure 5B:
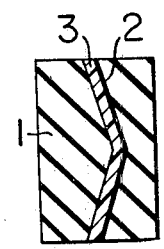

Another embodiment of the single sheet model of the inventive interconnectors is shown in FIG. 5. The interconnector shown there has a rectangular cross section of the rod member 1 and the sheet member 3 is integrally embedded in the rod member 1 as bent along the center line thereof having a dog-legged cross section as shown in FIG. 5(b). The linear conductive bodies 2 are each a ribbon of, for example, a metal and bonded on one surface of the sheet member 3. Such a combination of the sheet member 3 and the linear conductive bodies 2 is readily obtained by the techniques of etching in which a laminate of the insulating sheet 3 and a metal foil bonded thereto is subjected to etching, e.g. photoetching, in stripes leaving the linear portions 2. The thus prepared insulating sheet member 3 bearing the linear conductive bodies 2 thereon is then integrally molded with the insulating rubbery elastomer for the rod member 1 to give the interconnector.

As is understood from the above description, each of the interconnectors illustrated in the drawing has an anisotropic conductivity in the direction shown by the arrow B and can be used in just the same manner as the conventional interconnectors of the similar type as mounted between two circuit boards with compression in the direction of the arrow B yet with no or little extension or stretching in the longitudinal direction shown by the arrow A so that the condition of the electric connection between the interconnector and the circuit board can be always very reliable regardless of the strength of the compression. The reliableness in the electric connection is further enhanced by virtue of the curved or bent configuration of the insulating sheet member or members facilitating to avoid local stress in the rod member which is readily bulged out laterally to release the stress caused by the compression in mounting of the interconnector. The composite structure of the inventive interconnector is so unique and advantageous as described above that the performance of the electronic instruments assembled with the interconnector can be imparted with remarkably improved stability in the electric connection between circuits.

What is claimed is:

1. An interconnector of press-contact type which comprises
    (a) a rod member made of an electrically insulating rubbery elastomer having two opposite surfaces longitudinally extending substantially in parallel with each other,
    (b) a plurality of linear bodies of an electrically conductive material embedded in the rod member as distributed over substantially whole length of the rod member and as oriented in such a manner that the ends of each of the linear bodies appear on the opposite surfaces of the rod member, and
    (c) at least one sheet member of an electrically insulating, flexible material having higher rigidity than the electrically insulating rubbery elastomer of the rod member and embedded within or bonded to the surface of the rod member as extending in the direction in parallel to the longitudinal direction of the rod member in such a disposition that the sheet member is bent or curved as viewed in the longitudinal direction of the rod member.

2. The interconnector as claimed in claim 1 wherein the sheet member has a Young's modulus at least 1.5 times larger than the Young's modulus of the electrically insulating rubbery elastomer of the rod member.

* * * * *